(12) United States Patent
Uchida et al.

(10) Patent No.: US 11,032,899 B2
(45) Date of Patent: Jun. 8, 2021

(54) PLASMA PROCESSING APPARATUS AND PLASMA PROCESSING METHOD

(71) Applicant: Tokyo Electron Limited, Tokyo (JP)

(72) Inventors: Yohei Uchida, Miyagi (JP); Tetsuji Sato, Miyagi (JP); Shojiro Yahata, Miyagi (JP); Taira Takase, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/565,651

(22) Filed: Sep. 10, 2019

(65) Prior Publication Data
US 2020/0107429 A1   Apr. 2, 2020

(30) Foreign Application Priority Data
Oct. 2, 2018  (JP) .............................. JP2018-187411

(51) Int. Cl.
*H01J 37/32* (2006.01)
*H05H 1/24* (2006.01)
*H05H 1/28* (2006.01)

(52) U.S. Cl.
CPC ..... *H05H 1/2406* (2013.01); *H01J 37/32027* (2013.01); *H05H 1/28* (2013.01); *H05H 2001/2418* (2013.01)

(58) Field of Classification Search
CPC .......... H01J 37/32091; H01J 37/32522; H01J 37/32027; H01J 37/32568; H01J 37/32935; H01J 37/32926; H01J 37/32715; H05H 1/2406; H05H 1/28; H05H 2001/2418
See application file for complete search history.

(56) References Cited

FOREIGN PATENT DOCUMENTS

| JP | 2004-538633 A | 12/2004 |
|---|---|---|
| WO | 03/015133 A2 | 2/2003 |

*Primary Examiner* — Yuechuan Yu
(74) *Attorney, Agent, or Firm* — Pearne & Gordon LLP (57) ABSTRACT

A plasma processing apparatus includes a cooling plate having a fixing surface to which an upper electrode is fixed, the cooling plate having, on the fixing surface, an electrostatic chuck configured to attract the upper electrode by an attraction force generated by an applied voltage; a power supply configured to apply the voltage to the electrostatic chuck; and a power supply controller configured to control the power supply such that an absolute value of the voltage applied to the electrostatic chuck is increased based on a degree of consumption of the upper electrode.

9 Claims, 4 Drawing Sheets

PLASMA PROCESSING APPARATUS AND PLASMA PROCESSING METHOD

CROSS-REFERENCE TO RELATED APPLICATION

This application claims the benefit of Japanese Patent Application No. 2018-187411 filed on Oct. 2, 2018, the entire disclosures of which are incorporated herein by reference.

TECHNICAL FIELD

The various aspects and embodiments described herein pertain generally to a plasma processing apparatus and a plasma processing method.

BACKGROUND

Conventionally, there is known a plasma processing apparatus configured to perform a plasma processing such as etching on a processing target object such as a semiconductor wafer by using plasma. Such a plasma processing apparatus includes, for example, a lower electrode configured to hold the processing target object and an upper electrode disposed above the lower electrode. The plasma processing apparatus performs the plasma processing on the processing target object by applying a preset high frequency power to the lower electrode or the upper electrode. Further, in the plasma processing apparatus, the upper electrode is fixed to a cooling plate having a cooling device.

Patent document 1 discloses a technique of allowing the upper electrode and the cooling plate to firmly adhere to each other in the plasma processing apparatus. That is, an electrostatic chuck is provided on a fixing surface of the cooling plate to which the upper electrode is fixed, and the upper electrode is attracted to the electrostatic chuck by applying a preset voltage to the electrostatic chuck during a processing period of the plasma processing.

Patent Document 1: Japanese Translation of PCT Application Patent Publication No. 2004-538633

SUMMARY

In one exemplary embodiment, a plasma processing apparatus includes a cooling plate; an upper electrode; an electrostatic chuck provided between the cooling plate and the upper electrode and configured to attract the upper electrode; a power supply configured to apply a voltage to the electrostatic chuck; and a power supply controller configured to control an absolute value of the voltage applied to the electrostatic chuck from the power supply. The power supply controller performs controlling the power supply such that the absolute value is increased based on a degree of consumption of the upper electrode.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts will be assigned same reference numerals.

[Configuration of Plasma Processing Apparatus 10]

Figure 1:
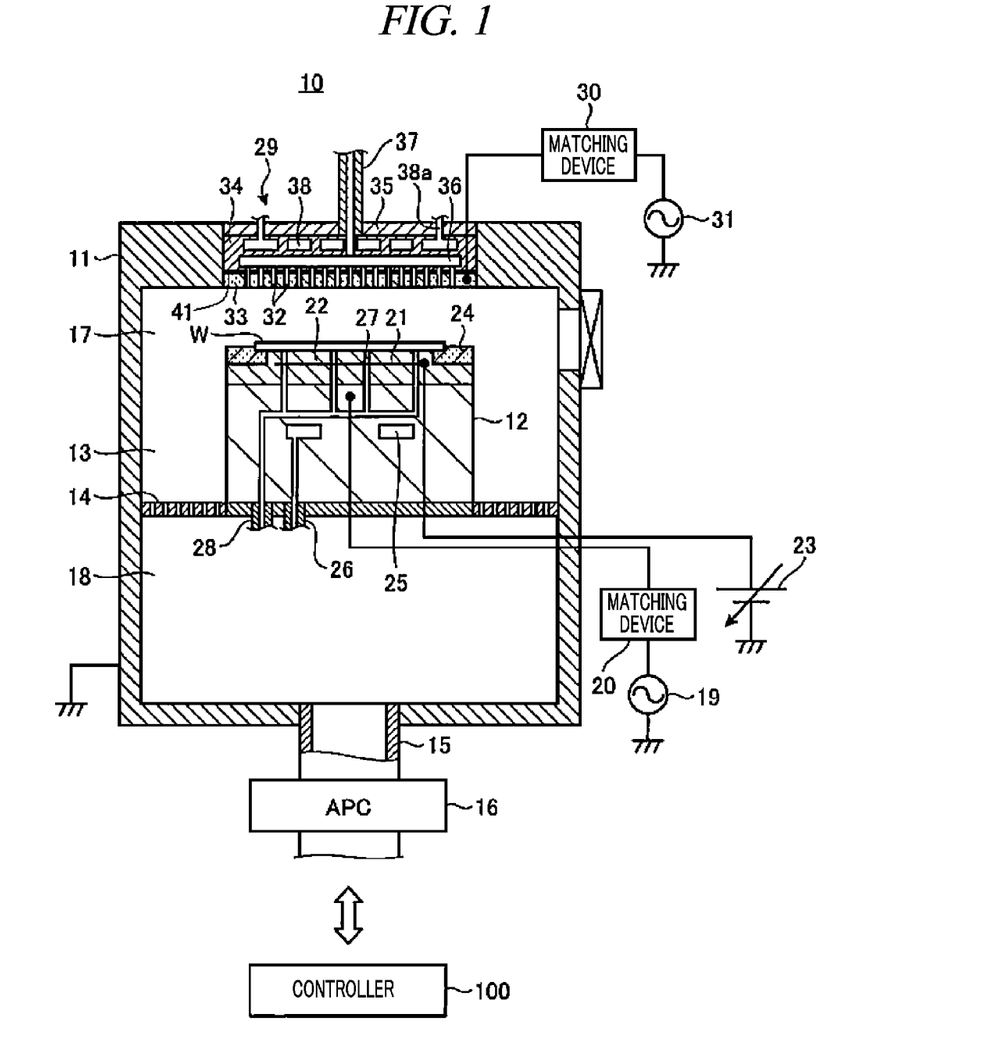
FIG. 1 is a cross sectional view illustrating a configuration example of a plasma processing apparatus according to an exemplary embodiment.

FIG. 1 is a cross sectional view illustrating a configuration example of a plasma processing apparatus 10 according to an exemplary embodiment. In FIG. 1, the plasma processing apparatus 10 is equipped with a cylindrical chamber 11, made of aluminum or the like, having a sealable inside. The chamber 11 is grounded. A placing table 12 made of a conductive material such as, but not limited to, aluminum is provided within the chamber 11. The placing table 12 is a cylindrical table configured to place thereon a semiconductor wafer (hereinafter, simply referred to as "wafer") W as an example of a processing target object. This placing table 12 also serves as a lower electrode.

Formed between a sidewall of the chamber 11 and a side surface of the placing table 12 is an exhaust path 13 configured as a path through which a gas above the placing table 12 is exhausted to the outside of the chamber 11. An exhaust plate 14 is placed at a portion of the exhaust path 13. The exhaust plate 14 is a plate-shaped member having a multiple number of holes, and serves as a partition plate which partitions the chamber 11 into an upper section and a lower section. The upper section of the chamber 11 partitioned by the exhaust plate 14 is a reaction chamber 17 in which a plasma etching is performed. Further, an exhaust pipe 15 through which a gas within the chamber 11 is exhausted is connected to an exhaust chamber (manifold) 18 in the lower section of the chamber 11. The exhaust plate 14 serves to capture or reflect plasma generated in the reaction chamber 17 to suppress a leak of the plasma into the exhaust chamber 18. The exhaust pipe 15 is connected to an exhaust device via an APC (Adaptive Pressure Control) valve 16. The exhaust device decompresses the chamber 11 and maintains the inside of the chamber 11 in a preset vacuum level.

A first high frequency power supply 19 is connected to the placing table 12 via a matching device 20. The first high frequency power supply 19 is configured to supply a high frequency bias power ranging from, e.g., 400 kHz to 13.56 MHz to the placing table 12. The matching device 20 is configured to suppress reflection of the high frequency power from the placing table 12, thus maximizing efficiency for the supply of the high frequency bias power to the placing table 12.

An electrostatic chuck 22 having an electrostatic electrode plate 21 therein is provided on a top surface of the placing table 12. When the wafer W is placed on the placing table 12, the wafer W is placed on the electrostatic chuck 22. The electrostatic electrode plate 21 is connected to a first DC power supply 23. The electrostatic chuck 22 generates an electrostatic force such as a Coulomb force by applying a voltage to the electrostatic electrode plate 21 from the first DC power supply 23. Thus, the wafer W is attracted and held by the electrostatic force.

Further, a circular ring-shaped focus ring 24 is disposed on the electrostatic chuck 22 to surround an edge of the wafer W. The focus ring 24 is made of a conductive member such as, but not limited to, silicon.

Furthermore, an annular coolant path 25 extending in, for example, a circumferential direction is provided within the placing table 12. A coolant of a low temperature such as cooling water or Galden (registered trademark) is supplied into the coolant path 25 from a chiller unit via a coolant pipeline 26 to be circulated therein. The placing table 12 cooled by this coolant of the low temperature cools the wafer W and the focus ring 24 via the electrostatic chuck 22.

In addition, a multiple number of heat transfer gas supply holes 27 are opened in the electrostatic chuck 22. A heat transfer gas such as a helium (He) gas is supplied into these heat transfer gas supply holes 27 via a heat transfer gas supply line 28. The heat transfer gas is supplied into a gap between an attraction surface of the electrostatic chuck 22 and a rear surface of the wafer W through the heat transfer gas supply holes 27. The heat transfer gas supplied into this gap serves to transfer heat of the wafer W to the electrostatic chuck 22.

A shower head 29 is disposed at a ceiling of the chamber 11, facing the placing table 12. The shower head 29 is connected to a second high frequency power supply 31 via a matching device 30. The second high frequency power supply 31 is configured to supply a high frequency power for plasma excitation having a frequency of, e.g., 40 MHz to the shower head 29. The matching device 30 is configured to suppress reflection of the high frequency power from the shower head 29, thus maximizing efficiency for the supply of the high frequency power for plasma excitation to the shower head 29. Further, this high frequency power for plasma excitation may be applied to the placing table 12.

The shower head 29 includes: an upper electrode 33 having a multiple number of gas holes 32; a cooling plate 34 configured to support the upper electrode 33 while allowing the upper electrode 33 to be suspended in a detachable manner; and a cover body 35 covering the cooling plate 34. Further, a buffer room 36 is provided within the cooling plate 34, and a gas inlet line 37 is connected to the buffer room 36. The shower head 29 diffuses a gas supplied from the gas inlet line 37 in the buffer room 36 and supplies the diffused gas into the reaction chamber 17 through the multiple number of gas holes 32.

The cooling plate 34 is equipped with a cooling mechanism and cools the upper electrode 33. The cooling mechanism includes: a spiral-shaped or a ring-shaped coolant path 38 extending in a circumferential direction thereof; and a coolant pipeline 38a. A coolant of a low temperature such as cooling water or Galden (registered trademark) is supplied into the coolant path 38 from a chiller unit via the coolant pipeline 38a to be circulated therein. A temperature of the upper electrode 33 is increased by the heat transferred from the plasma. As a resolution, in the plasma processing apparatus 10 according to the exemplary embodiment, by configuring the upper electrode 33 and the cooling plate 34 to firmly adhere to each other via the electrostatic chuck 41, the heat of the upper electrode 33 is transferred to the cooing plate 34. As a result, the upper electrode 33 is cooled.

The shower head 29 is configured to be detachable with respect to the chamber 11, and also serves as a cover of the chamber 11. If the shower head 29 is separated from the chamber 11, an operator can access a wall surface of the chamber 11 and constituent components therein. Accordingly, the operator can clean the wall surface of the chamber 11 and surfaces of the constituent components, thus removing a deposit adhering to the wall surface of the chamber 11 or the like.

An overall operation of the plasma processing apparatus 10 having the above-described configuration is controlled by a controller 100. The controller 100 is implemented by, for example, a computer and controls individual components of the plasma processing apparatus 10. The overall operation of the plasma processing apparatus 10 is controlled by the controller 100.

[Configuration of Shower Head 29]

Figure 2:
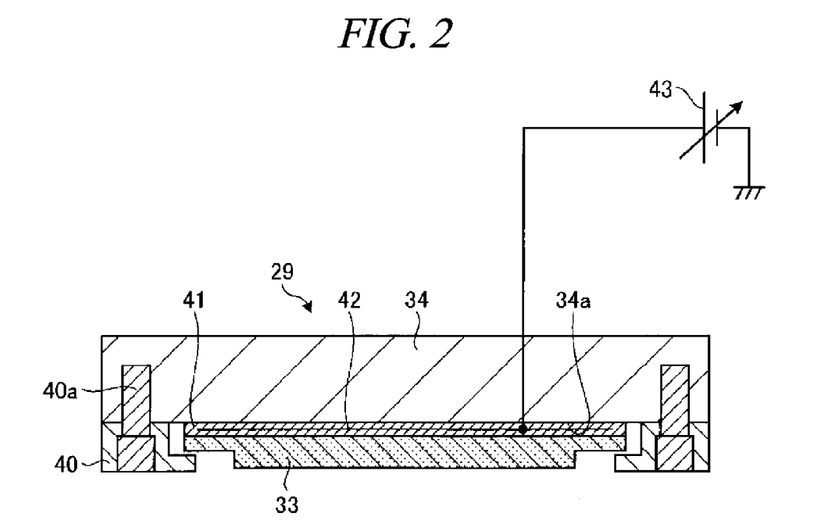
FIG. 2 is a cross sectional view illustrating an example of a configuration of main parts of a shower head in the exemplary embodiment.

Now, main parts of the shower head 29 will be explained with reference to FIG. 2. FIG. 2 is a cross sectional view illustrating an example configuration of the main parts of the shower head 29 according to the exemplary embodiment.

The shower head 29 is equipped with the upper electrode 33, the cooling plate 34 and a clamp member 40.

The upper electrode 33 is a disk-shaped member and made of a conductive material such as, but not limited to, silicon. The upper electrode 33 is provided with the multiple number of gas holes 32 through which a processing gas is passed (see FIG. 1).

The cooling plate 34 is a disk-shaped member and made of a conductive material such as, but not limited to, aluminum. A bottom surface of the cooling plate 34 is configured as a fixing surface 34a to which the upper electrode 33 is fixed. The clamp member 40 presses the peripheral portion of the upper electrode 33 against the fixing surface 34a of the cooling plate 34 via a screw 40a, so that the clamp member 40 holds the upper electrode 33.

An electrostatic chuck 41 is provided on the fixing surface 34a of the cooling plate 34. The electrostatic chuck 41 is inserted between the fixing surface 34a of the cooling plate 34 and the upper electrode 33. The electrostatic chuck 41 includes a pair of dielectric films and an electrode plate 42 embedded between the pair of dielectric films. The electrode plate 42 is made of a conductive film. The electrode plate 42 is electrically connected with a second DC power supply 43. The second DC power supply 43 is configured to vary an absolute value of a DC voltage generated therefrom. The second DC power supply 43 applies the DC voltage to the electrode plate 42 under the control of the controller 100. The electrostatic chuck 41 generates an electrostatic force such as a Coulomb force by the voltage applied to the electrode plate 42 from the second DC power supply 43. Thus, the upper electrode 33 is attracted and held by the electrostatic chuck 41.

Further, the electrostatic chuck 41 shown in FIG. 2 is configured as a unipolar type. In this case, in a period during which plasma is generated, the upper electrode 33 is held by the electrostatic chuck 41, and in a rest period rather than the period, the upper electrode 33 is held by the clamp member 40. However, the electrostatic chuck 41 may be configured as a bipolar type. To be specific, the electrostatic chuck 41 may be configured such that a first electrode and a second electrode are provided between a pair of dielectric film and voltages of different polarity may be applied to the first electrode and the second electrode. In this case, the upper electrode 33 is held by the electrostatic chuck 41 regardless of presence/absence of the plasma.

[Configuration of Controller 100]

Figure 3:
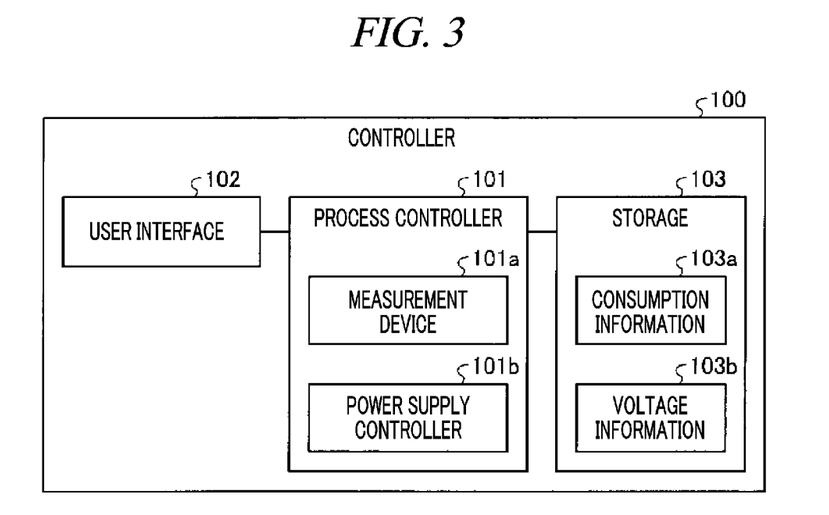
FIG. 3 is a block diagram illustrating a configuration example of a controller configured to control the plasma processing apparatus according to the exemplary embodiment.

Now, the controller 100 will be elaborated. FIG. 3 is a block diagram illustrating a configuration example of the controller 100 configured to control the plasma processing apparatus 10 according to the exemplary embodiment. The controller 100 includes a process controller 101, a user interface 102 and a storage 103.

The process controller 101 is equipped with a CPU (Central Processing Unit) and controls the individual components of the plasma processing apparatus 10.

The user interface 102 includes a keyboard through which a process manager inputs a command to manage the plasma processing apparatus 10, a display configured to visually display an operational status of the plasma processing apparatus 10, and so forth.

The storage 103 stores therein a control program (software) for implementing various kinds of processings in the plasma processing apparatus 10 under the control of the process controller 101, and a recipe including processing condition data or the like. Further, the storage 103 stores therein various kinds of information for coping with the deterioration of the adhesiveness between the upper electrode 33 and the cooling plate 34 due to the consumption of the upper electrode 33. By way of example, the storage 103 stores therein consumption information 103*a* indicating the degree of consumption of the upper electrode 33 and voltage information 103*b* indicating the absolute value of the DC voltage applied to the electrostatic chuck 41 (that is, the electrode plate 42). Further, the control program and the recipe including the processing condition data may be used by being stored in a computer-readable recording medium (for example, a hard disk, an optical disk such as a DVD, a flexible disk, a semiconductor memory, or the like) or may be used on-line by being transmitted from another apparatus through, for example, a dedicated line whenever necessary.

The process controller 101 has an internal memory for storing a program and data. The process controller 101 reads out the control program stored in the storage 103 and executes the read-out control program. As the control program is operated, the process controller 101 serves as various kinds of processors. By way of example, the process controller 101 has a measurement device 101*a* and a power supply controller 101*b*. Although the plasma processing apparatus 10 according to the exemplary embodiment is described for an example case where the process controller 101 has the functions as the measurement device 101*a* and the power supply controller 101*b*, the functions of the measurement device 101*a* and the power supply controller 101*b* may be implemented by a plurality of controllers in a distributed manner.

In the plasma processing apparatus 10, however, if the plasma processing is performed on the wafer W, the upper electrode 33 is consumed. The degree of consumption of the upper electrode 33 increases as a total processing time of the plasma processing increases. Further, in the plasma processing apparatus 10, if the upper electrode 33 is consumed, the strength of the upper electrode 33 is degraded. As a result, the upper electrode 33 is bent and a gap is generated between the upper electrode 33 and the cooling plate 34, so that the removal of the heat of the upper electrode 33 is hindered.

Figure 4:
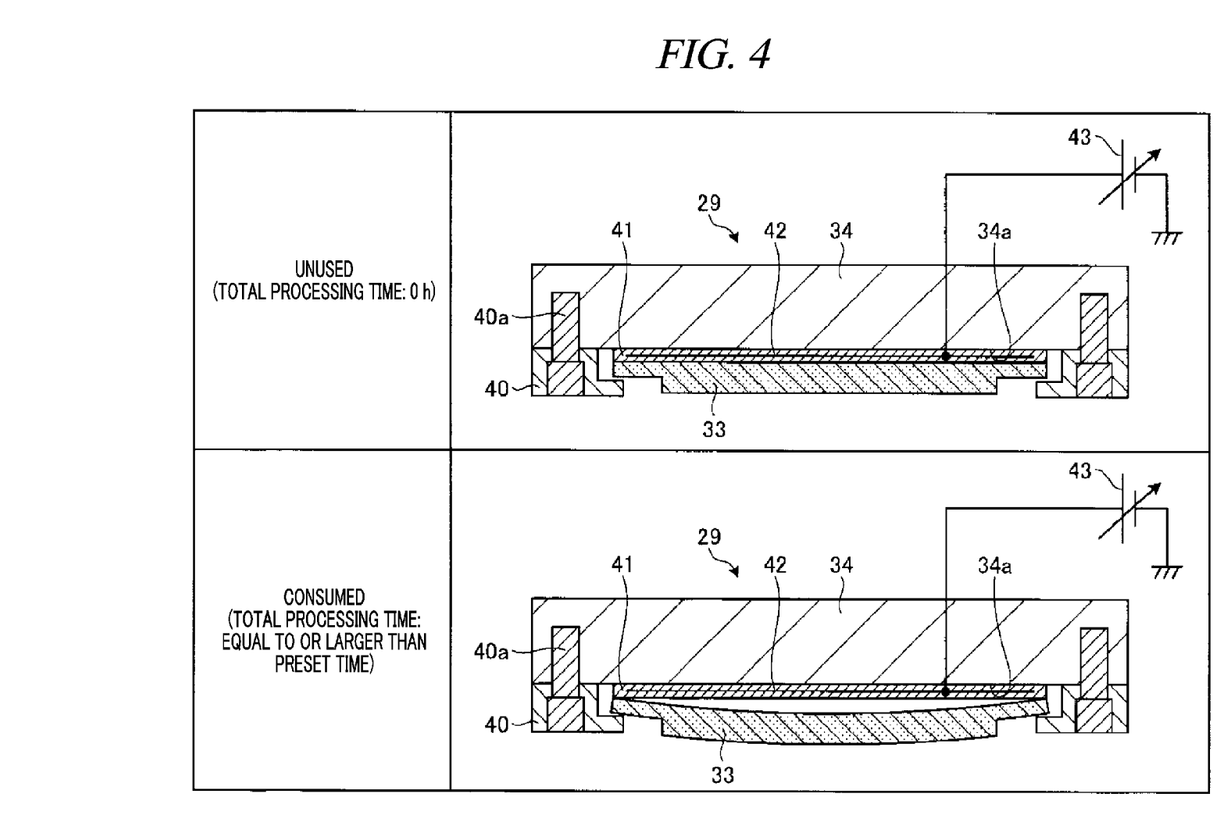
FIG. 4 is a diagram for describing an example of consumption of an electrode plate.

FIG. 4 is a diagram for describing an example of the consumption of the upper electrode 33. An upper part of FIG. 4 illustrates a state of the upper electrode 33 when the upper electrode 33 is unused one (that is, when the total processing time of the plasma processing is 0 h). A lower part of FIG. 4 illustrates a state of the upper electrode 33 when the total processing time of the plasma processing is equal or larger than a preset time.

In the prior art, the attraction of the upper electrode 33 is carried out by applying the regular voltage to the electrostatic chuck 41 (that is, the electrode plate 42).

Meanwhile, in case of attracting the upper electrode 33 by applying the regular voltage to the electrode plate 42, the attraction force of the electrostatic chuck 41 is maintained constant regardless of the degree of consumption of the upper electrode 33. Accordingly, if the strength of the upper electrode 33 is weakened with the consumption of the upper electrode 33, the attraction force of the electrostatic chuck 41 may become insufficient. By way of example, in the example shown in the lower part of FIG. 4, if the total processing time of the plasma processing is equal to or larger than the preset time, a surface of the upper electrode 33 is etched, and, thus, a thickness of the upper electrode 33 is reduced. As a result, the strength of the upper electrode 33 is reduced. If the strength of the upper electrode 33 is reduced, a sufficient attraction force of the electrostatic chuck 41 against a force acting in a direction in which the upper electrode 33 is bent cannot be obtained. Resultantly, the adhesiveness between the upper electrode 33 and the cooling plate 34 is degraded.

In the plasma processing apparatus 10, if the adhesiveness between the upper electrode 33 and the cooling plate 34 is degraded, the removal of the heat of the upper electrode 33 may be hindered, and the temperature of the upper electrode 33 may be increased. As a result, the processing characteristic of the plasma processing may be deteriorated.

As a resolution, in the plasma processing apparatus 10 according to the exemplary embodiment, the second DC power supply 43 is controlled such that the absolute value of the DC voltage applied to the electrostatic chuck 41 is increased based on the degree of consumption of the upper electrode 33.

Further, the control of the second DC power supply 43 may be performed whenever a preset total processing time of the plasma processing has elapsed, or may be performed whenever a preset total number of the wafers W are processed or whenever a preset total number of lots are processed. Alternatively, the control of the second DC power supply 43 may be performed continuously based on the degree of consumption of the upper electrode 33. Further, a timing in which the absolute value of the DC voltage applied to the electrostatic chuck 41 is increased by controlling the second DC power supply 43 may be after the wafer W is processed and before the processing of a next wafer W is begun, or may be during the wafer W is being processed based on the degree of consumption of the upper electrode 33.

Referring back to FIG. 3, the measurement device 101*a* is configured to measure the degree of consumption of the upper electrode 33. For example, the measurement device 101*a* measures the total processing time of the plasma processing and stores the measured total processing time of the plasma processing in the consumption information 103*a* indicating the degree of consumption of the upper electrode 33.

The power supply controller 101*b* is configured to control the second DC power supply 43 to increase the absolute value of the DC voltage applied to the electrostatic chuck 41 based on the degree of consumption of the upper electrode 33. By way of example, the power supply controller 101*b* is configured to control the second DC power supply 43 such that the absolute value of the DC voltage applied to the electrostatic chuck 41 is increased with the increase of the total processing time of the plasma processing measured by the measurement device 101*a*.

In this plasma processing apparatus 10, even if the strength of the upper electrode 33 is reduced with the consumption of the upper electrode 33, the attraction force of the electrostatic chuck 41 is enhanced as the absolute value of the DC voltage applied to the electrostatic chuck 41 is increased, and the force acting in the direction in which the upper electrode 33 is bent is canceled. The force acting in the direction in which the upper electrode 33 is bent may be, by way of non-limiting example, gravity acting on the upper electrode 33, a force acting on the upper electrode 33 caused by a pressure of the gas introduced into the buffer room 36, or the like. As the force acting in the direction in which the upper electrode 33 is bent is canceled by the attraction force of the electrostatic chuck 41, the degradation of the adhesiveness between the upper electrode 33 and the cooling plate 34 due to the consumption of the upper electrode 33 can be suppressed.

For example, in the plasma processing apparatus 10, the voltage information 103*b* indicating the absolute value of the DC voltage is previously stored in the storage 103 for each value of the total processing time of the plasma processing such that the absolute value of the DC voltage applied to the electrostatic chuck 41 is increased with the increase of the total processing time of the plasma processing.

The power supply controller 101*b* reads out from the voltage information 103*b* the absolute value of the DC voltage corresponding to the total processing time of the plasma processing measured by the measurement device 101*a* at a preset timing in the plasma processing on the wafer W. Then, the power supply controller 101*b* controls the second DC power supply 43 to supply a DC voltage having the read-out absolute value.

Accordingly, in the plasma processing apparatus 10, the attraction force of the electrostatic chuck 41 can be gradually increased with the consumption of the upper electrode 33. Therefore, the deterioration of the adhesiveness between the upper electrode 33 and the cooling plate 34 due to the consumption of the upper electrode 33 can be suppressed.

[Flow of Control]

Figure 5:
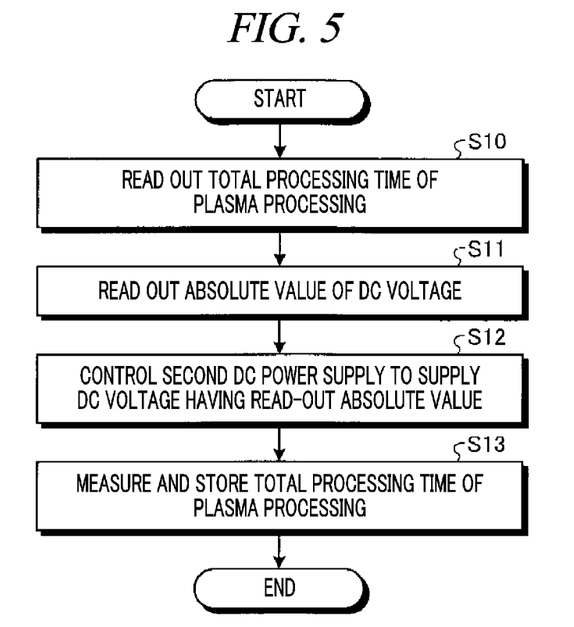
FIG. 5 is a flowchart illustrating an example of a flow of an electrostatic attraction processing according to the exemplary embodiment.

Now, an electrostatic attraction processing performed in the plasma processing apparatus 10 according to the exemplary embodiment will be discussed. FIG. 5 is a flowchart illustrating an example flow of the electrostatic attraction processing according to the exemplary embodiment. This electrostatic attraction processing is performed at a preset timing, for example, a timing when a plasma processing upon the wafer W is begun.

The power supply controller 101*b* reads out the total processing time of the plasma processing stored in the consumption information 103*a* (process S10). That is, the power supply controller 101*b* reads out from the consumption information 103*a* the total processing time of the plasma processing measured by the measurement device 101*a* at the last time.

The power supply controller 101*b* reads out the absolute value of the DC voltage corresponding to the read-out total processing time of the plasma processing from the voltage information 103*b* (process S11). The power supply controller 101*b* controls the second DC power supply 43 to apply the DC voltage having this read-out absolute value (process S12).

The measurement device 101*a* measures the total processing time of the plasma processing to which the current processing time of the plasma processing is added, and stores the measurement result in the consumption information 103*a* (process S13). Then, the processing is completed.

As stated above, the plasma processing apparatus 10 according to the exemplary embodiment includes the cooling plate 34, the upper electrode 33, the electrostatic chuck 41 provided between the cooling plate 34 and the upper electrode 33 and configured to attract the upper electrode 33, the second DC power supply 43 configured to apply the voltage to the electrostatic chuck 41 and the power supply controller 101*b* configured to control the absolute value of the DC voltage applied to the electrostatic chuck 41 from the second DC power supply 43. The power supply controller 101*b* performs controlling the second DC power supply 43 such that the absolute value of the DC voltage is increased based on the degree of consumption of the upper electrode 33. Accordingly, the plasma processing apparatus 10 is capable of suppressing the deterioration of the adhesiveness between the upper electrode 33 and the cooling plate 34 caused by the consumption of the upper electrode 33. As a result, the plasma processing apparatus 10 is capable of suppressing the temperature rise of the upper electrode 33 by improving the efficiency for the removal of the heat of the upper electrode 33. Therefore, the processing characteristic of the plasma processing can be bettered.

Further, the plasma processing apparatus 10 according to the exemplary embodiment further includes the measurement device 101*a*. The measurement device 101*a* measures the total processing time of the plasma processing. The power supply controller 101*b* controls the second DC power supply 43 to increase the absolute value of the DC voltage applied to the electrode plate 42 with the increase of the measured total processing time of the plasma processing. Accordingly, the plasma processing apparatus 10 is capable of increasing the attraction force of the electrostatic chuck 41 gradually with the increase of the total processing time of the plasma processing. Therefore, the deterioration of the adhesiveness between the upper electrode 33 and the cooling plate 34 caused by the consumption of the upper electrode 33 can be suppressed.

The above-described exemplary embodiment is not meant to be anyway limiting. The exemplary embodiment can be changed and modified in various ways. By way of example, the above exemplary embodiment has been described for the example where the degree of consumption of the upper electrode 33 is measured by measuring the total processing time of the plasma processing with the measurement device 101*a*. However, the method of measuring the degree of consumption of the upper electrode 33 is not limited thereto. For example, the plasma processing apparatus 10 may measure the degree of consumption of the upper electrode 33 by measuring, with the measurement device 101a, a difference between a temperature of the upper electrode 33 and a previously measured temperature of an unused upper electrode 33 during the processing period of the plasma processing. For example, in the plasma processing apparatus 10, a thermometer configured to measure a temperature by an optical fiber, a thermometer configured to measure a temperature by optical interference, or the like may be provided at a member located above the upper electrode 33 to measure the difference between the temperature of the upper electrode 33 and the previously measured temperature of the unused upper electrode 33. The member above the upper electrode 33 may be, by way of non-limiting example, the cooling plate 34. In the plasma processing apparatus 10, if the strength of the upper electrode 33 is reduced due to the consumption of the upper electrode 33, the enough attraction force of the electrostatic chuck 41 against the force acting in the direction in which the upper electrode 33 is bent may not be obtained. As a result, the adhesiveness between the upper electrode 33 and the cooling plate 34 is weakened. The force acting in the direction in which the upper electrode 33 is bent may be, by way of non-limiting example, the gravity acting on the upper electrode 33, the force acting on the upper electrode 33 caused by the pressure of the gas introduced into the buffer room 36, or the like. If the adhesiveness between the upper electrode 33 and the cooling plate 34 is weakened, the difference between the temperature of upper electrode 33 and the previously measured temperature of the unused upper electrode 33 is increased. Thus, the power supply controller 101b controls the second DC power supply 43 to increase the absolute value of the DC voltage applied to the electrostatic chuck 41 at a timing when the measured difference between the temperature of the upper electrode 33 and the previously measured temperature of the unused upper electrode 33 exceeds a predetermined threshold value. As a consequence, in the plasma processing apparatus 10, the deterioration of the adhesiveness between the upper electrode 33 and the cooling plate 34 due to the consumption of the upper electrode 33 can be suppressed. Moreover, the power supply controller 101b may control the second DC power supply 43 to increase the absolute value of the voltage applied to the electrostatic chuck 41 from zero to a value larger than zero (e.g., 2500 V) at the aforementioned timing. That is, for a preset period after the plasma processing is begun, the upper electrode 33 is held by the clamp member 40 and the power supply controller 101b controls the second DC power supply 43 such that the voltage is not applied to the electrostatic chuck 41. Afterwards, at a time point when the difference between the measured temperature of the upper electrode 33 and the previously measured temperature of the unused upper electrode 33 exceeds the preset threshold value, the second DC power supply 43 may be controlled such that the voltage is applied to the electrostatic chuck 41.

Moreover, in the above-described exemplary embodiment, the single electrostatic chuck 41 is provided on the entire fixing surface 34a of the cooling plate 34, and this electrostatic chuck 41 attracts the upper electrode 33. However, the exemplary embodiment is not limited thereto, and multiple electrostatic chucks may be provided. The electrostatic chuck 41 may be divided into a central electrostatic chuck and a peripheral electrostatic chuck. For example, the central electrostatic chuck is provided on a region of the fixing surface 34a of the cooling plate 34 corresponding to a central portion of the upper electrode 33. Meanwhile, the peripheral electrostatic chuck is provided on a region of the fixing surface 34a of the cooling plate 34 corresponding to the peripheral portion of the upper electrode 33. An electrode plate of the central electrostatic chuck and an electrode plate of the peripheral electrostatic chuck are electrically connected with the second DC power supply 43. The second DC power supply 43 applies the DC voltage to the electrode plate of the central electrostatic chuck and the electrode plate of the peripheral electrostatic chuck independently under the control of the controller 100. Thus, if the strength of the upper electrode 33 is degraded due to the consumption of the upper electrode 33, the central portion of the upper electrode 33, which is not pressed against the fixing surface 34a by the clamp member 40, may be easily bent. In consideration of this, the power supply controller 101b controls the second DC power supply 43 to increase the absolute value of the DC voltage applied to the central electrostatic chuck based on the degree of consumption of the upper electrode 33 while maintaining constant the absolute value of the DC voltage applied to the peripheral electrostatic chuck. Therefore, the plasma processing apparatus 10 is capable of suppressing the degradation of the adhesiveness between the upper electrode 33 and the cooling plate 34 due to the consumption of the upper electrode 33 more efficiently.

According to the exemplary embodiment, it is possible to suppress the deterioration of the adhesiveness between the upper electrode and the cooling plate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A plasma processing method performed in a plasma processing apparatus,
    wherein the plasma processing apparatus comprises:
    a cooling plate;
    an upper electrode;
    an electrostatic chuck provided between the cooling plate and the upper electrode and configured to attract the upper electrode;
    a power supply configured to apply a voltage to the electrostatic chuck; and
    a power supply controller configured to control an absolute value of the voltage applied to the electrostatic chuck from the power supply, and
    wherein the plasma processing method comprises:
    controlling the power supply such that the absolute value is increased based on a degree of consumption of the upper electrode.

2. The plasma processing method of claim 1,
    wherein the plasma processing apparatus further comprises a measurement device, and
    wherein the plasma processing method further comprises:
    measuring a total processing time of a plasma processing by the measurement device; and
    determining the degree of consumption of the upper electrode based on the measured total processing time.

3. The plasma processing method of claim 1,
wherein the plasma processing apparatus further comprises:
a measurement device configured to measure a total processing time of a plasma processing; and
a storage configured to store the absolute value of the voltage applied to the electrostatic chuck, and
wherein the plasma processing method further comprises:
storing, in the storage, voltage information indicating the absolute value corresponding to the total processing time such that the absolute value is increased as the total processing time of the plasma processing is increased;
measuring the total processing time of the plasma processing by the measurement device;
reading out, from the storage, the voltage information corresponding to the total processing time; and
applying, to the electrostatic chuck, the voltage corresponding to the read-out voltage information.

4. The plasma processing method of claim 1,
wherein the plasma processing apparatus further comprises:
a measurement device configured to measure a total processing time of a plasma processing; and
a storage configured to store relationship between consumption information indicating the degree of consumption of the upper electrode and voltage information indicating the absolute value of the voltage applied to the electrostatic chuck, and
wherein the plasma processing method further comprises:
determining the absolute value referring to the relationship.

5. The plasma processing method of claim 1,
wherein the controlling of the power supply is performed at a timing when a plasma processing on a wafer is begun.

6. The plasma processing method of claim 1,
wherein, in the controlling of the power supply, the power supply is controlled such that an attraction force of the electrostatic chuck to the upper electrode is gradually increased as a total processing time of a plasma processing is increased.

7. The plasma processing method of claim 1,
wherein the plasma processing apparatus further comprises a measurement device configured to measure a temperature of the upper electrode, and
wherein the plasma processing method further comprises:
measuring the temperature of the upper electrode by the measurement device;
calculating a difference between the measured temperature of the upper electrode and a previously measured temperature of an unused upper electrode; and
controlling, at a timing when the difference exceeds a preset threshold value, the power supply such that the absolute value of the voltage applied to the electrostatic chuck is increased.

8. The plasma processing method of claim 7,
wherein, in the controlling of the power supply, at the timing when the difference exceeds the preset threshold value, the power supply is controlled such that the absolute value of the voltage applied to the electrostatic chuck is increased from zero to a value larger than zero.

9. The plasma processing method of claim 1,
wherein the electrostatic chuck includes a central electrostatic chuck and a peripheral electrostatic chuck,
the power supply is configured to independently apply the voltage to the central electrostatic chuck and the peripheral electrostatic chuck, and
in the controlling of the power supply, the power supply is controlled such that the absolute value of the voltage applied to the central electrostatic chuck is increased based on the degree of consumption of the upper electrode while maintaining constant the absolute value of the voltage applied to the peripheral electrostatic chuck.

* * * * *